United States Patent
Oh et al.

(10) Patent No.: US 6,404,054 B1
(45) Date of Patent: Jun. 11, 2002

(54) TUNGSTEN LAYER FORMATION METHOD FOR SEMICONDUCTOR DEVICE AND SEMICONDUCTOR DEVICE USING THE SAME

(75) Inventors: Seong-tae Oh; Kyung-tae Kim; Hong-Joo Baek; Hun-ki Kim, all of Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/609,927

(22) Filed: Jul. 5, 2000

Related U.S. Application Data

(62) Division of application No. 09/357,126, filed on Jul. 20, 1999.

(30) Foreign Application Priority Data

Oct. 28, 1998 (KR) .............................................. 98-45540

(51) Int. Cl.⁷ ................................................ H01L 29/40
(52) U.S. Cl. ........................................ 257/751; 257/763
(58) Field of Search .................................. 257/751, 764, 257/763, 741, 774, 767; 438/672

(56) References Cited

U.S. PATENT DOCUMENTS 6,066,559 A * 5/2000 Gonzalez ..................... 438/672
6,146,991 A * 11/2000 Cheng et al. ................ 438/622

* cited by examiner

Primary Examiner—Roy Potter
(74) Attorney, Agent, or Firm—Volentine Francos, PLLC

(57) ABSTRACT

A tungsten layer formation method for a semiconductor device reduces resistivity of the tungsten layer without requiring modification of the conventional manufacturing system. The method includes treating the surface of a barrier metal layer formed over a semiconductor substrate in a pressure environment of over 40 Torr using $SiH_4$ gas; forming a tungsten seed layer on the treated barrier metal layer using $WF_6$ and $SiH_4$ gases, a mixing ratio $\{WF_6\}/\{SiH_4\}$ of the gases being less than or equal to one; and forming a tungsten layer on the treated barrier metal layer using $WF_6$ gas, the treated barrier metal layer having the tungsten seed layer formed thereon.

7 Claims, 3 Drawing Sheets

TUNGSTEN LAYER FORMATION METHOD FOR SEMICONDUCTOR DEVICE AND SEMICONDUCTOR DEVICE USING THE SAME

CROSS REFERENCE TO RELATED APPLICATIONS

This is a divisional application of application Ser. No. 09/357,126, filed Jul. 20, 1999, which is hereby incorporated by reference in its entirety for all purposes.

BACKGROUND OF THE INVENTION

1. Field of the Invention

The present invention relates to a tungsten layer formation method for a semiconductor device, and more particularly, to a tungsten layer formation method for a semiconductor device that reduces the resistivity of the tungsten layer and a semiconductor device using the same.

2. Description of the Related Art

Generally, a semiconductor device is manufactured by sequentially forming multiple layers, such as a polycrystalline layer, an oxide layer, an insulating layer and a metal layer, etc. on a semiconductor substrate (e.g., a wafer), and forming patterns thereon according to the characteristics of the is semiconductor device through conventional photolithography, etching and ion-implantation processes.

As the design rule for highly-integrated semiconductor devices continues to decrease, the aspect ratio of contact holes within such devices continues to increase. As a result of the increased aspect ratio, an aluminum layer can not be easily buried inside the contact holes using conventional sputtering methods. Recently, a CVD (Chemical Vapor Deposition) method has been introduced for depositing metal by way of a chemical reaction after vaporizing certain metal chemicals. A widely used method is a tungsten (W) CVD method which exhibits good contact hole burial characteristics.

The conventional CVD tungsten layer formation method is described with reference to FIG. 1. First, an insulating layer 11 such as an oxide layer or the like is formed on the semiconductor substrate 10. Thereafter, a portion of the insulating layer 11 is removed, by patterning and etching for example, so as to form contact holes 12.

A barrier metal layer 16 is then formed on the insulating layer 11, with the barrier metal layer 16 comprising a titanium (Ti) layer 13 and a titanium nitride (TiN) layer 15, each having a thickness of about 700 Å, which are sequentially formed. The surface of the barrier metal layer 16 is treated using $SiH_4$ gas under a pressure environment of between 4.5 to 40 Torr.

Then, a tungsten seed layer (not shown) is formed on the barrier metal layer 16 using $WF_6$ and $SiH_4$ gas with the mixing ratio of the gases $\{WF_6\}:\{SiH_4\}$ being about 1:1 to 3:1, under the same pressure environment as above, that is, 4.5 to 40 Torr. Thereafter, a tungsten layer 18 of about 4400 Å in thickness is formed on the treated barrier metal layer 16 using $WF_6$ and $H_2$.

Although the tungsten layer 18 formed as described above is easily buried inside the contact hole, the resistivity ($\rho$:$\mu\Omega$·cm) is four to five times as high as the aluminum layer used for conventional metal pattern lines. As a result, the operational speed of the semiconductor device is decreased and the power consumption is increased when using the tungsten metal pattern lines.

When the tungsten layer 18 having a polycrystalline structure is formed as described above, the average grain size of the tungsten layer 18 is about 2000 to 2500 Å and the area encompassed within the grain boundary is increased, thereby increasing the resistivity because of the increase in electrical resistance within the boundary.

In an attempt to overcome this problem, some have added diborane ($B_2H_6$) gas to reduce the resistivity of the tungsten layer during the formation of the tungsten layer. By adding diborane ($B_2H_6$) gas during the tungsten layer formation, the grain size of the tungsten layer having a polycrystalline structure is increased to thereby reduce the resistance. As a result, the resistivity of the tungsten layer may be reduced from about 11.4–11.7 $\mu\Omega$·cm down to about 8–9 $\mu\Omega$·cm.

However, there are drawbacks to using this technique, for example, the requirement for installing a separate diborane gas line and mass flow controller. In addition, there is a decrease in the burial characteristics of the tungsten layer and the process window.

Others in the art have formed metal pattern line structures wherein a tungsten plug is formed inside the contact hole, and an aluminum layer is formed thereon. In this manner, the defects experienced with the burial characteristics of the aluminum layer, and the problems with the high resistivity of the tungsten layer have been minimized.

Again there are drawbacks to using this technique because during the formation of the metal pattern lines comprising a tungsten plug and an aluminum layer, a planarization process such as CMP (Chemical Mechanical Polishing) or Etch Back should be additionally carried out after forming the tungsten layer for the tungsten plug. The planarization process increases both the processing time and costs for manufacturing semiconductor devices.

Further, there is a possibility of additional process failures occurring during the planarization process.

SUMMARY OF THE INVENTION

The present invention is directed to providing a tungsten layer formation method for a semiconductor device that reduces the resistivity of the tungsten layer without the need to alter the conventional manufacturing system.

To achieve this and other advantages and in accordance with the purposes of the present invention, the tungsten layer formation method for semiconductor devices includes treating the surface of a barrier metal layer formed over a semiconductor substrate in a pressure environment of over 40 Torr using $SiH_4$ gas. A tungsten seed layer is then formed on the treated barrier metal layer using $WF_6$ and $SiH_4$ gases, with the mixing ratio $\{WF_6\}/\{SiH_4\}$ of the gases being less than or equal to 1. A tungsten layer is thereafter formed on the treated barrier metal layer having the tungsten seed layer formed thereon. The tungsten layer is formed by supplying $WF_6$ gas or a mixed gas of $WF_6$ and $H_2$ gas. The barrier metal layer comprises a titanium (Ti) layer and a titanium nitride (TiN) layer, which are sequentially formed.

Preferably, the treating is carried out in a pressure environment of over 90 Torr. Also, the tungsten seed layer is formed in a pressure environment that is less than atmospheric pressure, and preferably, the tungsten seed layer is formed in a pressure environment of between 4 and 5 Torr.

In another aspect of the present invention, a tungsten layer formation method for semiconductor devices includes forming an insulating layer over a semiconductor substrate; forming contact holes in the insulating layer; forming a barrier metal layer along the inner wall of the contact holes; treating the surface of the barrier metal layer using $SiH_4$ gas in a pressure environment of over 40 Torr; forming a tungsten seed layer on the surface of the treated barrier metal layer using $WF_6$ and $SiH_4$ gases in which the ratio $\{WF_6\}/\{SiH_4\}$ of the gases is less than or equal to 1; and forming a tungsten layer over the treated barrier metal layer having the tungsten seed layer using $WF_6$ gas mixed with $H_2$ gas. The barrier metal layer comprises a titanium (Ti) layer and a titanium nitride (TiN) layer, which are sequentially formed.

Preferably, the treating is carried out in a pressure environment of over 90 Torr. Also, the tungsten seed layer is formed in a pressure environment that is less than atmospheric pressure, and preferably, the tungsten seed is layer is formed in a pressure environment of between 4 and 5 Torr.

In another aspect of the present invention, a semiconductor device includes an insulating layer over a semiconductor substrate, a contact hole formed inside the insulating layer, a barrier metal layer formed along the inner wall of the contact hole, and a tungsten layer formed on the barrier metal layer, the tungsten layer being formed by treating the surface of the barrier metal layer using $SiH_4$ in a pressure environment of over 40 Torr, forming a tungsten seed layer on the treated surface of the barrier metal layer using $WF_6$ and $SiH_4$ gases, in which the ratio $\{WF_6\}/\{SiH_4\}$ of the gases is less than or equal to 1, and forming a tungsten layer over the treated barrier metal layer having the tungsten seed layer using $WF_6$ gas mixed with $H_2$ gas.

The average grain size of the tungsten layer is between 3500 and 4000 Å and the thickness of the tungsten layer is between 4000 and 5000 Å. The resulting resistivity of the tungsten layer is between 9.9 and 10.1 $\mu\Omega\cdot cm$.

It is to be understood that both the foregoing general description and the following detailed description are exemplary and explanatory and are intended to provide further explanation of the invention as claimed.

DETAILED DESCRIPTION OF PREFERRED EMBODIMENTS

Preferred embodiments of the present invention will now be described in detail with reference to the accompanying drawings.

Figure 1:
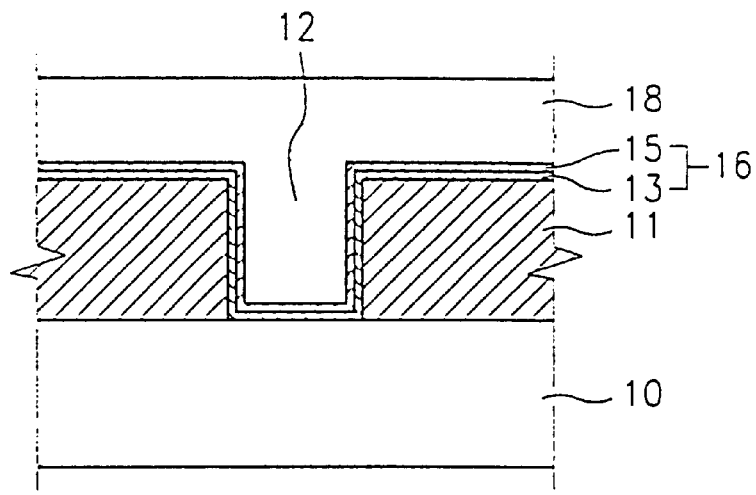
FIG. 1 is a cross-sectional view illustrating a conventional process for forming a tungsten layer.
Figure 2:
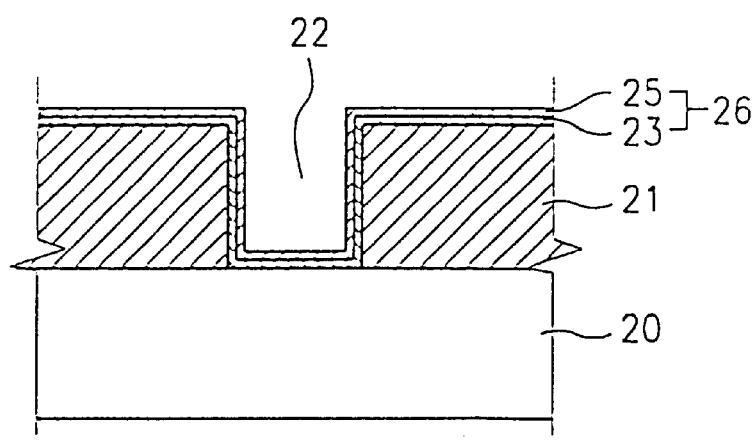
FIGS. 2, 3 and 4 are sequential cross-sectional views illustrating process sequences for a tungsten layer formation method according to one embodiment of the present invention.
Figure 3:
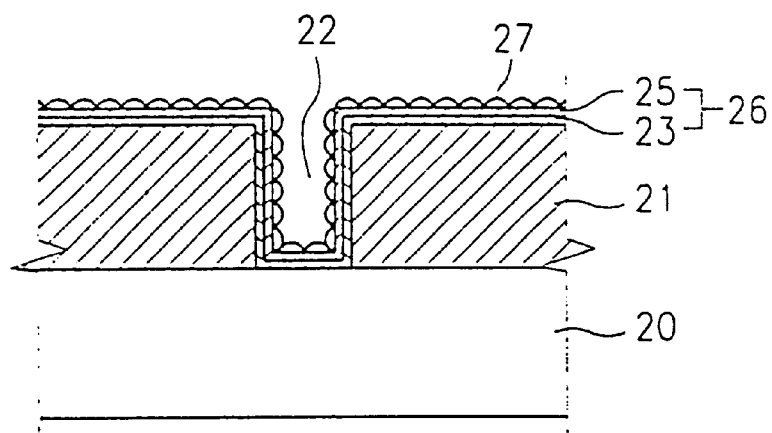
Figure 4:
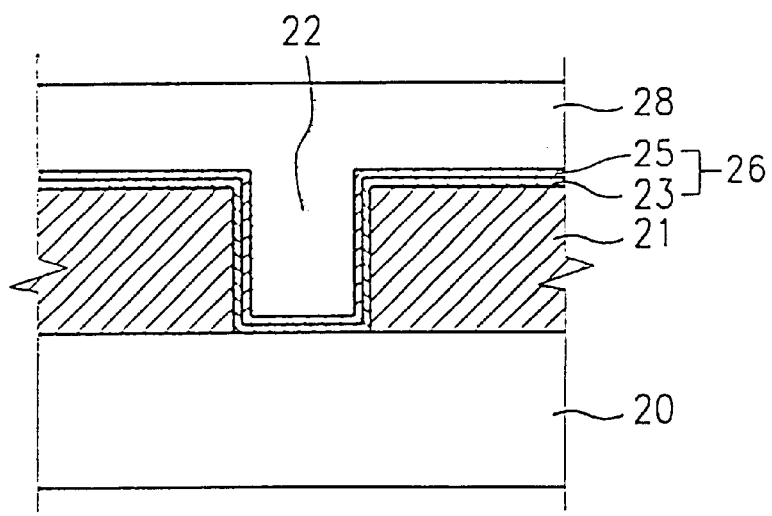
Figure 5:
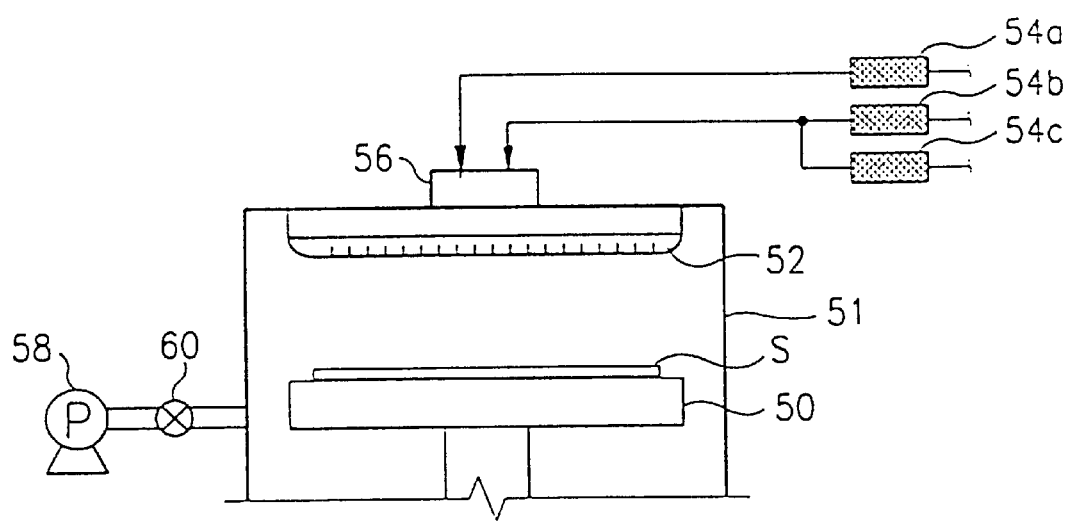
FIG. 5 is a schematic diagram illustrating a conventional chemical vapor deposition system for forming a tungsten layer of a semiconductor device.

FIGS. 2, 3 and 4 are sequential cross-sectional views illustrating process sequences for forming a tungsten layer according to the present invention, and FIG. 5 is a schematic diagram illustrating a conventional chemical vapor deposition system for forming a tungsten layer of a semiconductor device.

Referring first to FIG. 5, the chemical vapor deposition system includes a heater block 50 functioning as a chuck for mounting a semiconductor substrate (S). During the formation of the tungsten layer, the heater block 50 heats the back side of the semiconductor substrate (S) up to a designated temperature in accordance with the prevailing process conditions.

A shower head 52 is provided above the substrate (S) in the upper portion of a chamber 51 in which the semiconductor substrate (S) is mounted. The shower head 52 has a plurality of holes formed therein, through which processing gases are uniformly introduced. A gas mixer 56 is provided on the upper side of the shower head 52 for mixing the gases introduced from the respective mass flow controllers 54a, 54b, 54c.

During operation, after supplying each of the gases from the mass flow controllers 54a, 54b, 54c to the gas mixer 56, at flow settings corresponding to the prevailing process conditions, the gases are mixed and then uniformly introduced into the chamber 51 through the shower head 52. In FIG. 5 the mass flow controller comprises multiple elements, including a $SiH_4$ gas mass flow controller 54a, a $WF_6$ gas mass flow controller 54b, and a $H_2$ gas mass flow controller 54c.

On a side of the chamber 51 there are provided a vacuum pump 58 and a pressure control valve 60 for forming the desired pressure environment inside the chamber 51 according to the processing conditions.

Now, returning to FIG. 2, the method of forming the tungsten layer will be described using the apparatus of FIG. 5. An insulating layer 21, such as an oxide layer or the like, is formed on the semiconductor substrate 20. A portion of the insulating layer 21 is then removed, by conventional photolithographic patterning and etching processes, for example, such that a contact hole 22 is formed on the insulating layer 21. The contact hole 22 exposes a portion of the semiconductor substrate 20.

A barrier metal layer 26, comprising a sequentially formed titanium (Ti) layer 23 and a titanium nitride (TiN) layer 25, is formed along the surface of the insulating layer 21 having the contact hole 22. That is, the barrier metal layer 26 is formed on the side walls of the contact hole 22, the exposed surface of the semiconductor substrate 20, and along the surface of the insulating layer 21.

In the present invention the barrier metal layer 26 improves the attachment with the tungsten layer 28 later formed over the barrier metal layer 26, and also prevents damage to the semiconductor substrate 20 that is exposed by the contact holes 22. The barrier metal layer 26 may be formed, for example, by sputtering or by Low Pressure Chemical Vapor Deposition (LPCVD), and has a thickness of less than 2000 Å.

The semiconductor substrate 20 having the barrier metal layer 26 formed thereon is then fixed on the heater block 50 within the chamber 51 shown in FIG. 5, and to facilitate the formation of the tungsten layer 28 on the barrier metal layer 26, the pressure in the chamber 51 is maintained at over 40 Torr using the vacuum pump 58 and the pressure control valve 60. Preferably, the pressure in the chamber 51 is maintained at over 90 Torr.

$SiH_4$ gas is supplied through the $SiH_4$ gas mass flow controller 54a for treating the surface of the barrier metal layer 26. During this treatment step, a silicon layer of about 100 to 200 Å in thickness is formed on the barrier metal layer 26. This silicon layer has several advantages including: preventing a decrease in the incubation time needed for the formation of the tungsten layer; increasing the attachment of the barrier metal layer 26 and the tungsten layer; and preventing damage to the barrier metal layer 26.

As shown in FIG. 3, a tungsten seed layer 27 is formed on the barrier metal layer 26 whose surface has been treated as previously described. The tungsten seed layer 27 is formed using $WF_6$ and $SiH_4$ gases, in which the ratio $\{WF_6\}/\{SiH_4\}$ of the gases is less than or equal to 1, by operation of the SiH$_4$ gas mass flow controller 54a and the WF$_6$ gas mass flow controller 54b. The tungsten seed layer 27 is formed in order to increase the uniformity of the tungsten layer 28 formed on the barrier metal layer 26.

In FIG. 4, using WF$_6$ gas only, or a mixed gas of WF$_6$ and H$_2$ in which WF$_6$ is used as main gas and H$_2$ gas is used as carrier gas, the tungsten layer 28 having a polycrystalline structure is formed on the barrier metal layer 26. The thickness of the tungsten layer 28 is about 4000 to 5000 Å, preferably 4400 Å, and the average grain size is increased from the 2000 to 2500 Å as in the conventional case to about 3500 to 4000 Å in accordance with the present invention. The resulting resistivity of the tungsten layer 28 in accordance with the present invention is about 9.9–10.1 $\mu\Omega$·cm, which is approximately 10% lower than the conventional non-diborane gas case, and which approaches the resistivity of the case where diborane (B$_2$H$_6$) gas is added, but without the drawbacks associated with either conventional method.

That is, by increasing the size of the grains in the tungsten layer 28, the size of the grain boundary having a polycrystalline structure is decreased, and the electrical resistivity of the grain boundary is thereby decreased.

The characteristics and features of the present invention may be achieved using in a conventional deposition apparatus as shown in FIG. 5, and the tungsten layer having a low resistivity can be efficiently formed, by maintaining the chamber at a specific pressure, controlling the mass flow of the processing gases, and carrying out the surface treatment of the barrier metal layer and the formation of the tungsten seed layer. Therefore, without altering the conventional deposition apparatus, the tungsten layer can be formed, with the resulting tungsten layer having both good burial characteristics and a decreased resistivity.

Accordingly, the above method can be employed in manufacturing semiconductor devices having sophisticated patterns so that the resistivity of the pattern line and the interface are decreased, the speed of the device is increased, and flexibility in the pattern structure for the metal pattern can be attained.

While the present invention has been described in detail, it should be understood that various changes, substitutions and alterations can be made thereto without departing from the spirit and scope of the invention as defined by the appended claims.

What is claimed is:

1. A semiconductor device comprising:
    an insulating layer over a semiconductor substrate;
    a contact hole formed in the insulating layer and exposing a portion of the semiconductor substrate;
    a barrier metal layer formed along an inner wall of the contact hole and the exposed portion of the semiconductor substrate;
    a surface treatment layer comprising silicon formed on the barrier metal layer;
    a tungsten seed layer formed in the surface treatment layer; and
    a tungsten layer formed on the tungsten seed layer.

2. The semiconductor device of claim 1, wherein the barrier metal layer comprises a titanium (Ti) layer and a titanium nitride (TiN) layer, and wherein the surface treatment layer is formed on the TiN layer.

3. The semiconductor device of claim 1, wherein an average grain size value of the tungsten layer is between 3500 and 4000 Å and a thickness of the tungsten layer is between 4000 and 5000 Å.

4. The semiconductor device of claim 3, wherein a resistivity of the tungsten layer is between 9.9 and 10.1 $\mu\Omega$·cm.

5. The semiconductor device of claim 1, wherein barrier metal layer was formed using a WF$_6$ gas.

6. The semiconductor device of claim 5, wherein surface treatment layer was formed by supplying SiH$_4$ gas in a pressure environment of over 40 Torr to a surface of the barrier metal layer.

7. The semiconductor device of claim 6, wherein the tungsten seed layer was formed using a mixture of WF$_6$ and SiH$_4$ gases, wherein a mixing ratio {WF$_6$}/{SiH$_4$} of the gases is equal to or less than one.

* * * * *